(12) United States Patent
Sugiura et al.

(10) Patent No.: US 10,978,320 B2
(45) Date of Patent: Apr. 13, 2021

(54) PROTECTIVE MEMBER FORMING APPARATUS

(71) Applicant: DISCO CORPORATION, Tokyo (JP)

(72) Inventors: Kazuki Sugiura, Tokyo (JP); Yoshinori Kakinuma, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/704,717

(22) Filed: Dec. 5, 2019

(65) Prior Publication Data

US 2020/0185235 A1 Jun. 11, 2020

(30) Foreign Application Priority Data

Dec. 7, 2018 (JP) .............................. JP2018-230216

(51) Int. Cl.
| | | |
|---|---|---|
| *H01L 21/67* | (2006.01) | |
| *H01L 21/56* | (2006.01) | |
| *H01L 21/48* | (2006.01) | |
| *H01L 21/683* | (2006.01) | |
| *B05C 11/08* | (2006.01) | |

(52) U.S. Cl.
CPC .......... *H01L 21/6715* (2013.01); *B05C 11/08* (2013.01); *H01L 21/48* (2013.01); *H01L 21/56* (2013.01); *H01L 21/67017* (2013.01); *H01L 21/67121* (2013.01); *H01L 21/6838* (2013.01)

(58) Field of Classification Search
CPC ................. H01L 21/6715; H01L 21/56; H01L 21/67017; H01L 21/67121; G03F 7/0002; G03F 7/703
See application file for complete search history.

(56) References Cited

FOREIGN PATENT DOCUMENTS

| JP | 2012143723 A | * | 8/2012 |
| JP | 2016167546 A |   | 9/2016 |

* cited by examiner

*Primary Examiner* — Nahida Sultana
*Assistant Examiner* — Mohamed K Ahmed Ali
(74) *Attorney, Agent, or Firm* — Greer Burns & Crain Ltd.

(57) ABSTRACT

Apparatus for forming a protective member on a wafer includes a stage for mounting a sheet, the stage having a frame and a chuck table supported to and surrounded by the frame, the frame having a plurality of air supply holes opening to the upper surface of the frame. A holding unit is adapted to be moved to a position opposed to the stage for holding the wafer, and a resin supply unit supplies a liquid resin to the upper surface of the sheet placed on the stage. The liquid resin is formed into the protective member. A sheet pressing pad vertically movably supported so as to be opposed to the sheet is placed on the stage. The sheet pressing pad comes into contact with a part of the sheet placed on the stage in an area inside the air supply holes, thereby pressing the sheet.

3 Claims, 6 Drawing Sheets

PROTECTIVE MEMBER FORMING APPARATUS

BACKGROUND OF THE INVENTION

Field of the Invention

The present invention relates to an apparatus forming a protective member on a first surface of a wafer.

Description of the Related Art

In the case of slicing a solid cylindrical ingot by using a wire saw to form a disk-shaped wafer, undulation and warpage may be generated in the wafer. As a method of removing the undulation and warpage, there is a technique of applying a resin to a first surface of a wafer and next curing the resin to thereby form a protective member on the first surface of the wafer (see Japanese Patent Laid-open No. 2016-167546, for example).

SUMMARY OF THE INVENTION

In this kind of technique, the resin is supplied (dropped) to the upper surface of a sheet placed on a stage, and the wafer is next pressed on the resin to thereby uniformly apply the resin to the lower surface (first surface) of the wafer. Thereafter, the resin is cured to form the protective member. However, in this configuration, there is a problem that wrinkles may occur in the sheet in placing the sheet on the stage.

It is therefore an object of the present invention to provide a protective member forming apparatus which can place the sheet on the stage without the wrinkles.

In accordance with an aspect of the present invention, there is provided a protective member forming apparatus forming a protective member on a wafer having a first surface and a second surface opposite to the first surface, the protective member being formed on the first surface of the wafer, the protective member forming apparatus including a stage mounting a sheet, the stage having a frame and a chuck table supported to the frame so as to be surrounded by the frame, the frame having a plurality of air supply holes opening to an upper surface of the frame and connected to an air source; a holding unit adapted to be moved to a position opposed to the stage for holding the wafer; a resin supply unit supplying a resin to the upper surface of the sheet placed on the stage; a sheet pressing pad vertically movably supported so as to be opposed to the sheet placed on the stage; and a control unit controlling the operation of the air source, the holding unit, the resin supply unit, and the sheet pressing pad, in which the resin is supplied to the upper surface of the sheet placed on the stage by the resin supply unit, and the first surface of the wafer held by the holding unit is pressed through the resin against the sheet, thereby spreading the resin to form the protective member on the first surface of the wafer; the sheet pressing pad is controlled by the control unit to come into contact with a central portion of the sheet placed on the stage; the air source is controlled by the control unit to supply air from the air supply holes in a condition where the sheet pressing pad is in contact with the central portion of the sheet; a peripheral portion of the sheet not in contact with the sheet pressing pad is made to fly from the stage due to a flow of the air supplied from the air supply holes and to slide toward a peripheral edge of the stage, thereby removing wrinkles from the sheet.

With this configuration, the sheet pressing pad is adapted to come into contact with a part of the sheet placed on the stage so as to cover the plural air supply holes, in an area defined inside the plural air supply holes, thereby pressing the sheet. Accordingly, air is supplied from the plural air supply holes to thereby make a peripheral area of the sheet fly from the stage, the peripheral area being not in contact with the sheet pressing pad. As a result, the peripheral area of the sheet can slide toward the peripheral edge of the stage, thereby removing the wrinkles from the sheet. Accordingly, the sheet can be placed on the stage with the wrinkles removed before supplying the resin.

Preferably, the frame of the stage is coated with fluororesin.

With this configuration, the peripheral area of the sheet can easily slide on the upper surface of the frame of the stage owing to the flow of the air supplied from the air supply holes, so that the wrinkles can be removed from the sheet easily and effectively.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

A preferred embodiment of the present invention will now be described in detail with reference to the drawings. The present invention is not limited to this preferred embodiment. Further, the components used in this preferred embodiment may include those that can be easily assumed by persons skilled in the art or substantially the same elements as those known in the art. Further, the configurations described below may be suitably combined. Further, the configurations may be variously omitted, replaced, or changed without departing from the scope of the present invention.

Figure 1:
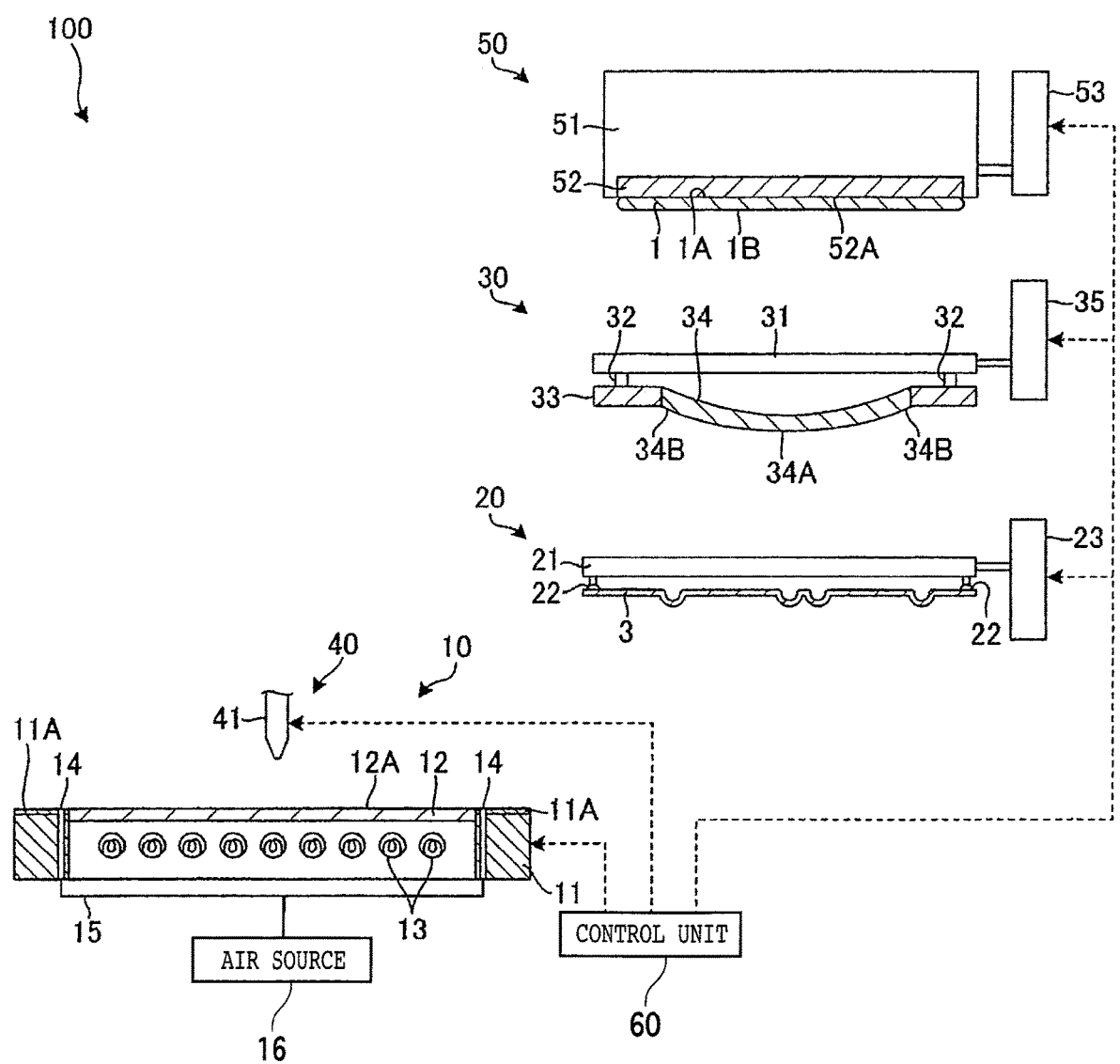
FIG. 1 is a schematic illustration illustrating a protective member forming apparatus according to a preferred embodiment of the present invention.
Figure 2:
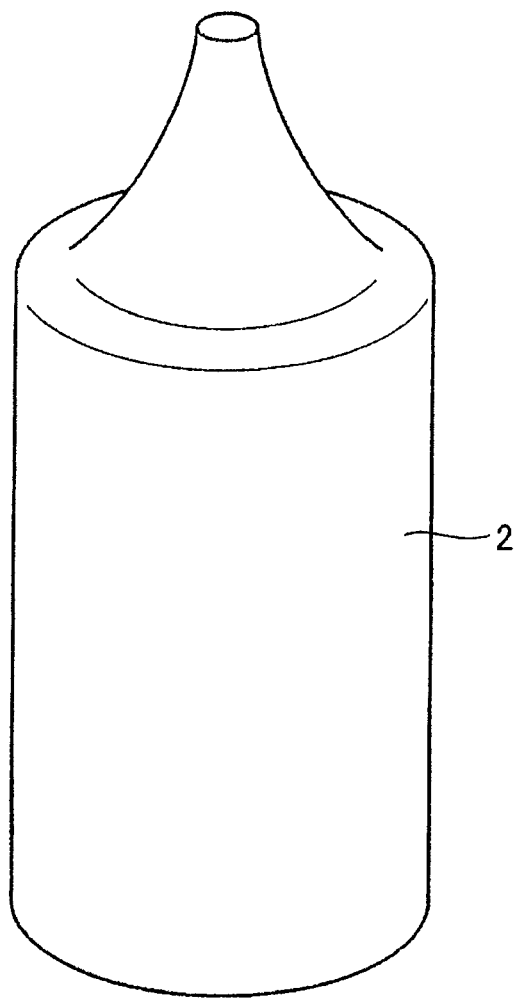
FIG. 2 is a schematic perspective view illustrating an ingot and a wafer obtained by slicing the ingot.
Figure 2:
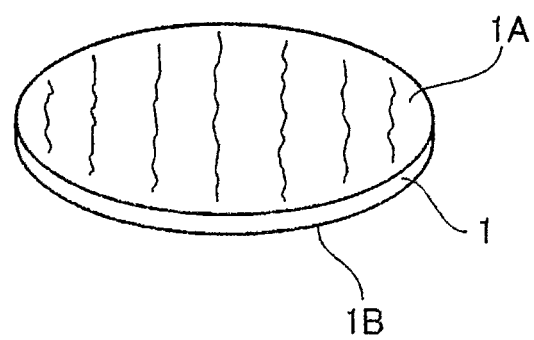

FIG. 1 is a schematic illustration of a protective member forming apparatus 100 according to a preferred embodiment of the present invention. FIG. 2 is a schematic perspective view illustrating a wafer 1 on which a protective member is to be formed by using the protective member forming apparatus 100 illustrated in FIG. 1. As illustrated in FIG. 2, the wafer 1 is an as-sliced wafer in the condition before forming a device pattern. For example, the wafer 1 may be obtained by slicing a solid cylindrical ingot 2 formed of a semiconductor such as silicon (Si), gallium arsenide (GaAs), and silicon carbide (SiC). The ingot 2 may be sliced by using a wire saw (not illustrated) to obtain a plurality of disk-shaped wafers. As illustrated in FIG. 2, the wafer 1 has an upper surface 1A and a lower surface 1B opposite to the upper surface 1A, in which the lower surface 1B is defined as a first surface and the upper surface 1A is defined as a second surface. Both the upper surface 1A and the lower surface 1B include a distortion element such as undulation and warpage caused by the wire saw in slicing the ingot 2. To remove the undulation and warpage, a resin is applied to the lower surface 1B (first surface) of the wafer 1 to form a protective member on the lower surface 1B. Thereafter, the upper surface 1A of the wafer 1 is first ground to be flattened, and the lower surface 1B of the wafer 1 is next ground to be flattened after removing the protective member.

As illustrated in FIG. 1, the protective member forming apparatus 100 includes a stage 10, a sheet transfer unit 20, a sheet pressing unit 30, a resin supply unit 40, a wafer transfer unit (holding unit) 50, and a control unit 60. In FIG. 1, these components of the protective member forming apparatus 100 are schematically illustrated and the layout of each component is not illustrated. Each component of the protective member forming apparatus 100 will now be described.

Figure 3:
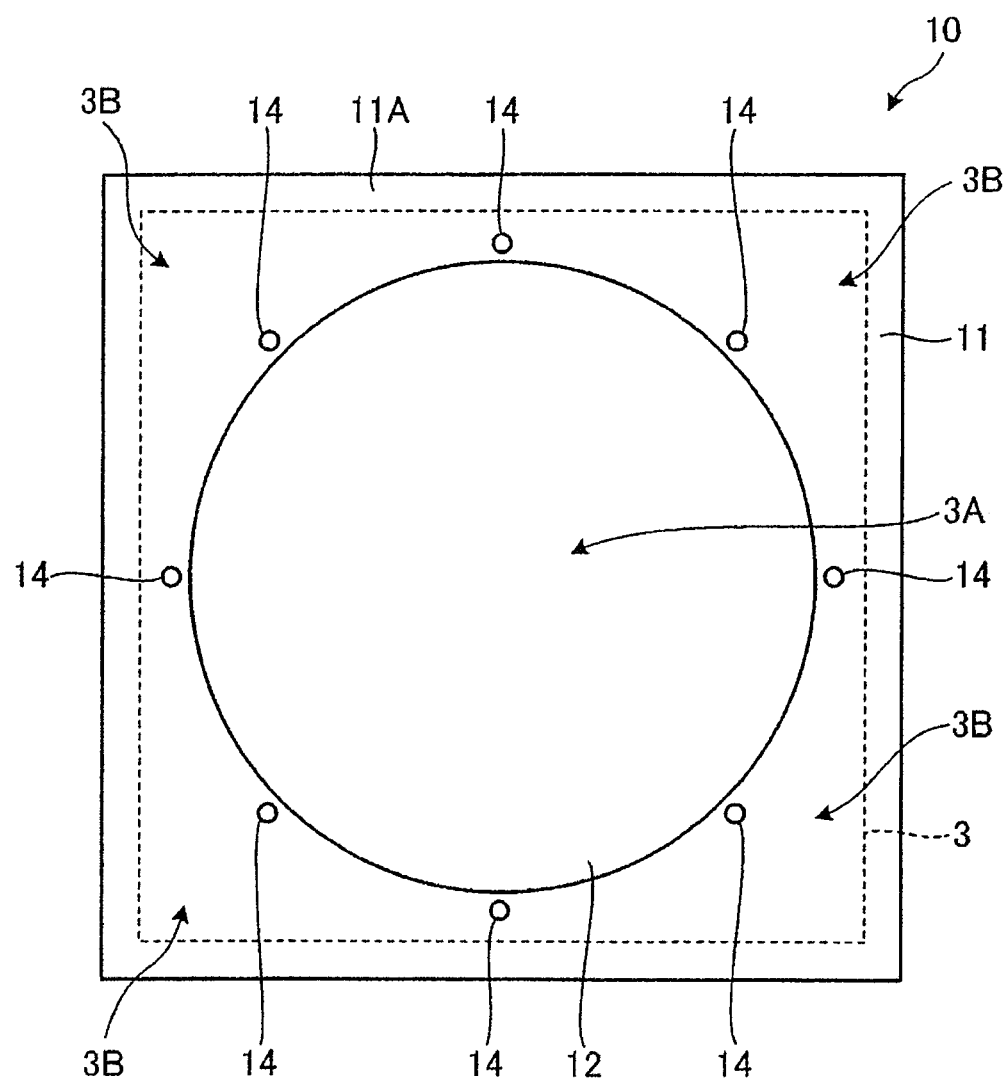
FIG. 3 is a plan view of a stage.

FIG. 3 is a plan view of the stage 10. The stage 10 functions as a working table for use in forming a protective member on the first surface of the wafer 1. As illustrated in FIG. 1, the stage 10 includes a stage body (frame) 11, a glass table (chuck table) 12 provided at an upper portion of the stage body 11, and a plurality of ultraviolet (UV) lamps 13 arranged inside the stage body 11. As illustrated in FIG. 3, the stage body 11 has a rectangular shape as viewed in plan. The stage body 11 has a central circular opening, and the glass table 12 having a circular shape is provided in this central circular opening of the stage body 11. That is, the glass table 12 is supported so as to be surrounded by the stage body 11 as a frame. The glass table 12 has a flat upper surface 12A as a mount surface for mounting a sheet 3. The glass table 12 may be replaced by another table formed of a material capable of transmitting ultraviolet light emitted from the lamps 13.

The stage body 11 is formed with a plurality of air supply holes 14 around the glass table 12. As illustrated in FIG. 3, the plural air supply holes 14 are annularly arranged at given intervals around the circular glass table 12. As illustrated in FIG. 1, each air supply hole 14 is connected through an air supply passage 15 to an air source 16. Accordingly, air is discharged from each air supply hole 14. The stage body 11 has an upper surface 11A, and each air supply hole 14 extends through the thickness of the stage body 11 so as to open to the upper surface 11A. While each air supply hole 14 extends perpendicularly to the upper surface 11A of the stage body 11 as illustrated in FIG. 1, it is more preferable that each air supply hole 14 is formed in the stage body 11 so as to extend radially outward and open to the upper surface 11A. Further, the stage body 11 is formed with a plurality of suction holes (not illustrated). The plural suction holes are arranged annularly outside the air supply holes 14. A vacuum source (not illustrated) is connected to the plural suction holes. Accordingly, a vacuum can be applied to the upper surface 11A of the stage body 11 to thereby hold the sheet 3 on the stage 10 under suction.

Further, the upper surface 11A of the stage body 11 is coated with (treated with) fluororesin, for example. Fluororesin has a coefficient of friction much less than that of metal, so that the sheet 3 placed on the stage 10 can easily slide on the upper surface 11A of the stage body 11. This kind of coating is preferably formed on the whole of the upper surface 11A of the stage body 11. However, if the upper surface 11A extends radially and continuously from the glass table 12, the coating of fluororesin may be partially formed on the upper surface 11A.

As illustrated in FIG. 1, the sheet transfer unit 20 functions to transfer the sheet 3 to the stage 10 and then place the sheet 3 on the stage 10. The sheet 3 functions to prevent that a liquid resin is directly dropped onto the stage 10, thereby protecting the upper surface of the stage 10 from damage and also saving time and effort for cleaning. The sheet 3 also functions to facilitate handling of the wafer 1 to which the liquid resin is applied. The sheet 3 has flexibility to some extent. As illustrated in FIG. 3, the sheet 3 has a size equal to or slightly smaller than that of the stage 10 as viewed in plan. While the sheet 3 has a rectangular shape similar to that of the stage 10, the shape of the sheet 3 is not limited. For example, the sheet 3 may have a circular shape. Further, the sheet 3 may be formed of polyolefin or polyethylene terephthalate (PET), for example.

The sheet transfer unit 20 includes a transfer arm 21 extending in a horizontal direction, a plurality of suction pads 22 provided on the lower surface of the transfer arm 21 for holding the sheet 3 under suction, an elevating unit 23 for vertically moving the transfer arm 21 toward or away from the stage 10, and a horizontal moving mechanism (not illustrated) for moving the elevating unit 23 in a horizontal direction. This horizontal moving mechanism functions to move the transfer arm 21 supported to the elevating unit 23 between a working position above the stage 10 and a standby position retracted from the stage 10 as illustrated in FIG. 1. A vacuum source (not illustrated) is connected to the suction pads 22. Accordingly, by controlling the vacuum source, suction holding of the sheet 3 by the suction pads 22 and the cancellation of the suction holding can be effected. The elevating unit 23 functions to support one end of the transfer arm 21 and move the transfer arm 21 in a vertical direction. In operation, the sheet 3 is held under suction by the suction pads 22. In this condition, the sheet 3 supported to the transfer arm 21 is transferred from the standby position to the working position above the stage 10.

The sheet pressing unit 30 functions to press a part (central portion) of the sheet 3 placed on the stage 10. The sheet pressing unit 30 includes a unit body 31 extending in a horizontal direction, a plurality of arm portions 32 extending downward from the lower surface of the unit body 31, a pad frame 33 connected to the arm portions 32 and thereby supported to the unit body 31 in substantially parallel relationship therewith, a pressing pad (sheet pressing pad) 34 supported to the pad frame 33, an elevating unit 35 for vertically moving the unit body 31 (the pressing pad 34) toward or away from the stage 10, and a horizontal moving mechanism (not illustrated) for moving the elevating unit 35 in a horizontal direction. This horizontal moving mechanism functions to move the pressing pad 34 supported to the elevating unit 35 between a working position above the stage 10 and a standby position retracted from the stage 10 as illustrated in FIG. 1.

The pad frame 33 is formed as a circular or rectangular frame smaller in size than the stage 10. The pressing pad 34 is formed of a material (e.g., rubber) softer than that of the pad frame 33. The pressing pad 34 has a circular or rectangular shape. The pressing pad 34 has a peripheral edge 34B surrounded and supported by the pad frame 33. The pressing pad 34 has a central portion 34A sagging from the peripheral edge 34B due to its own weight. The sheet 3 is adapted to be held between the central portion 34A of the pressing pad 34 and the glass table 12. Accordingly, the sheet 3 is adapted to be pressed by the central portion 34A of the pressing pad 34. The pressing pad 34 is preferably smaller in size than the glass table 12.

The resin supply unit 40 includes a nozzle 41 provided above the stage 10 (the sheet 3) for supplying a liquid resin 42 and a pump (not illustrated) for sending the liquid resin 42 to the nozzle 41. The liquid resin 42 is adapted to be supplied (dropped) by a predetermined amount from the nozzle 41 to the upper surface of the sheet 3 at a central portion thereof. The resin supply unit 40 may include a moving mechanism for moving the nozzle 41 between a working position above the stage 10 as illustrated in FIG. 1 and a standby position retracted from the stage 10 horizontally or upward. The liquid resin 42 is a material forming a protective member for protecting the lower surface (first surface) 1B of the wafer 1. For example, ultraviolet curing resin is used as the liquid resin 42.

The wafer transfer unit 50 includes a unit body 51 extending in a horizontal direction, a holding member 52 provided on the lower surface of the unit body 51 for holding the wafer 1, an elevating unit 53 for vertically moving the unit body 51 toward or away from the stage 10, and a horizontal moving mechanism (not illustrated) for moving the elevating unit 53 in a horizontal direction. This horizontal moving mechanism functions to move the unit body 51 supported to the elevating unit 53 between a working position above the stage 10 and a standby position retracted from the stage 10 as illustrated in FIG. 1. The holding member 52 is formed of porous ceramic, for example. A vacuum source (not illustrated) is connected to the holding member 52. The holding member 52 has a lower surface 52A (holding surface) for holding the upper surface (second surface) 1A of the wafer 1 under suction.

The control unit 60 is composed mainly of a microprocessor for controlling the protective member forming apparatus 100 as a whole. The microprocessor includes a computing unit such as a central processing unit (CPU) and a storing unit such as a read-only memory (ROM) and a random access memory (RAM). Connected to the control unit 60 are all of the stage 10, the sheet transfer unit 20, the sheet pressing unit 30, the resin supply unit 40, and the wafer transfer unit 50. Various operations including the sheet transfer, the liquid resin supply, and the wafer transfer are controlled by the microprocessor in the control unit 60.

Figure 4:
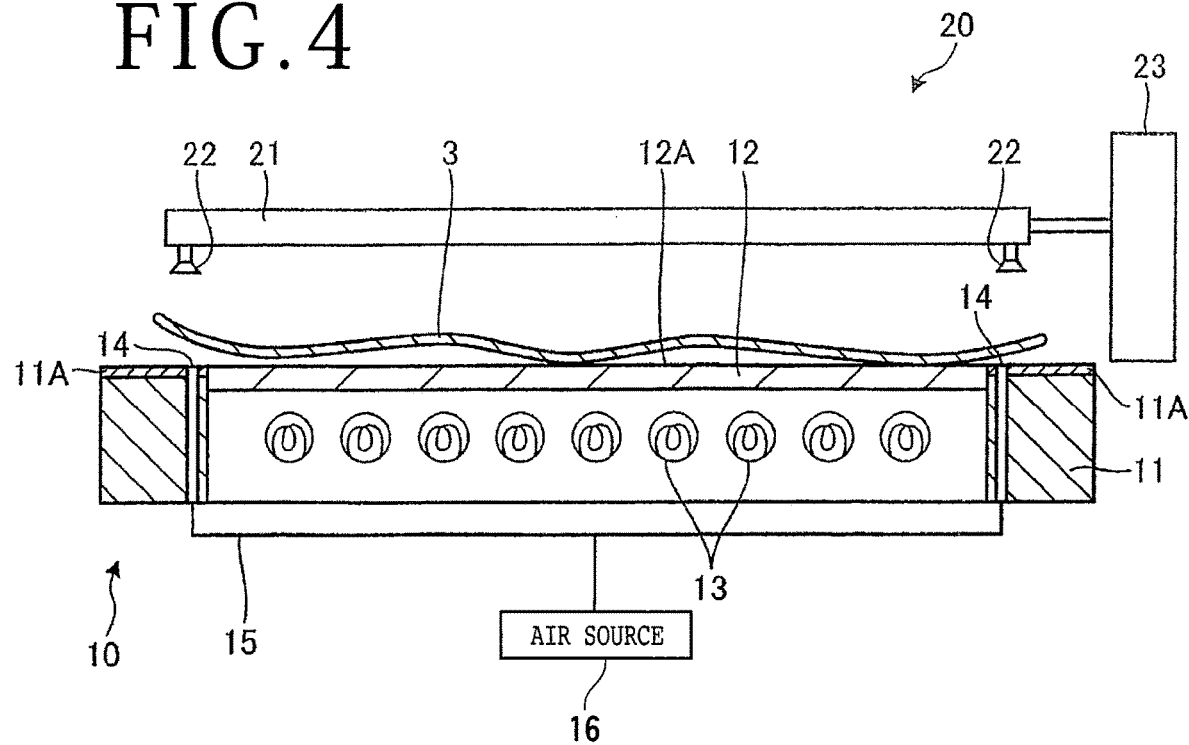
FIG. 4 is a schematic sectional view illustrating an operation of mounting a sheet on the stage.
Figure 5:
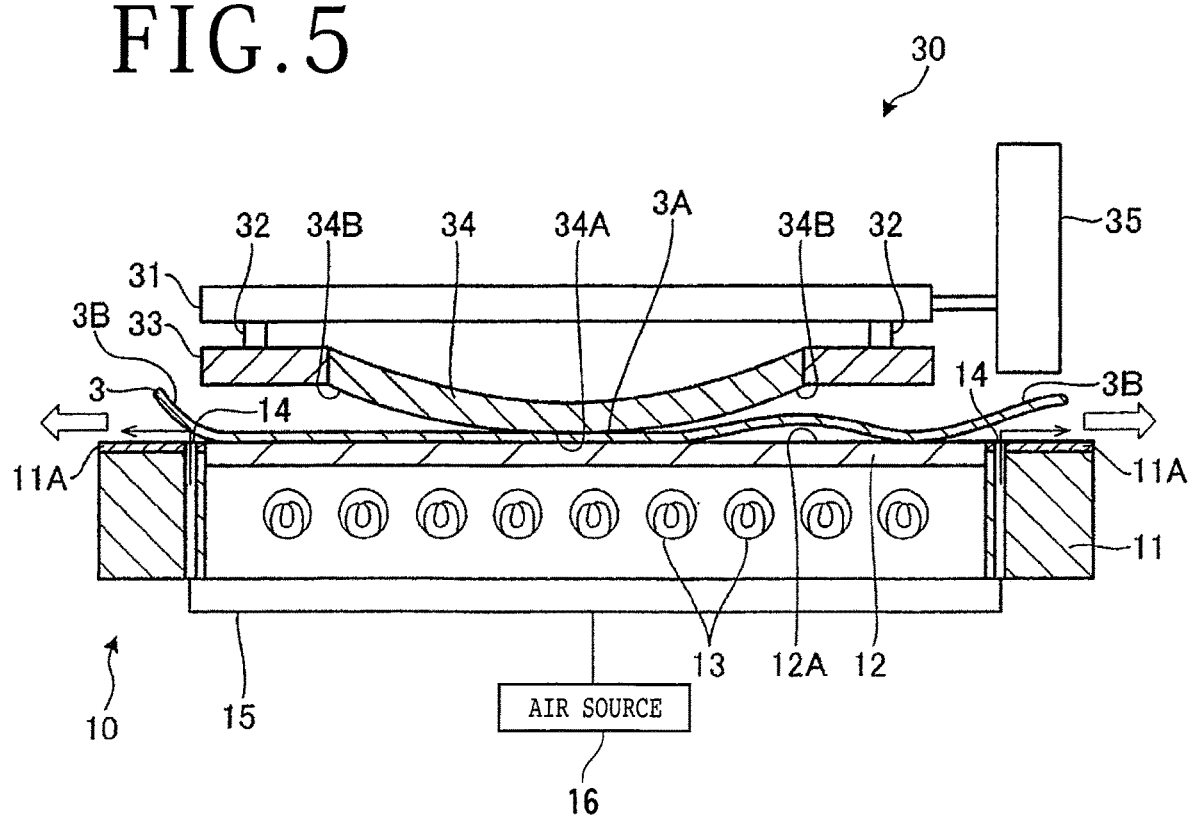
FIG. 5 is a schematic sectional view illustrating an operation of removing wrinkles from the sheet.
Figure 6:
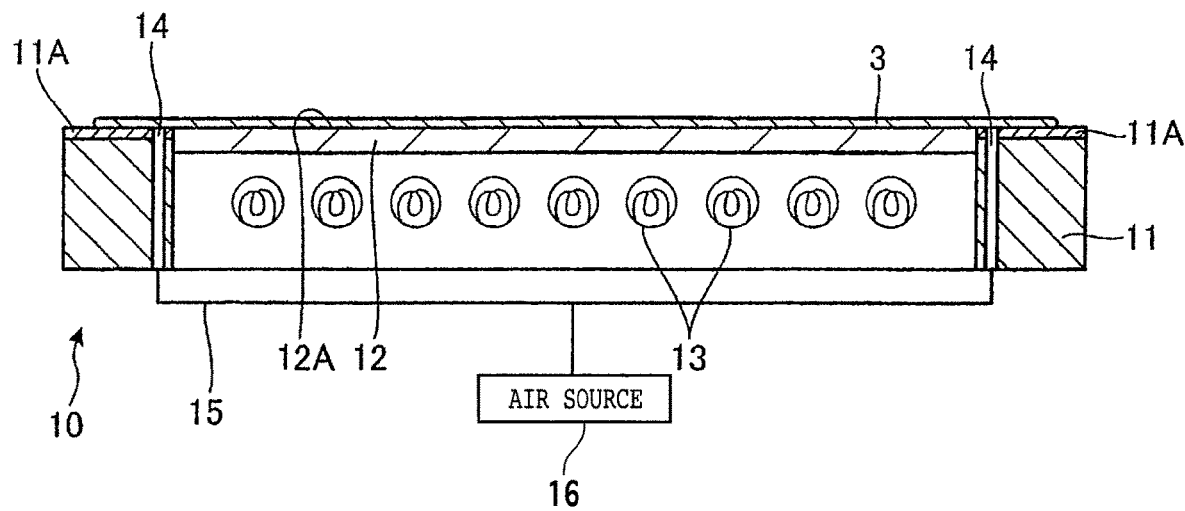
FIG. 6 is a schematic sectional view illustrating the sheet placed on the stage in the condition where the wrinkles have been removed.
Figure 7:
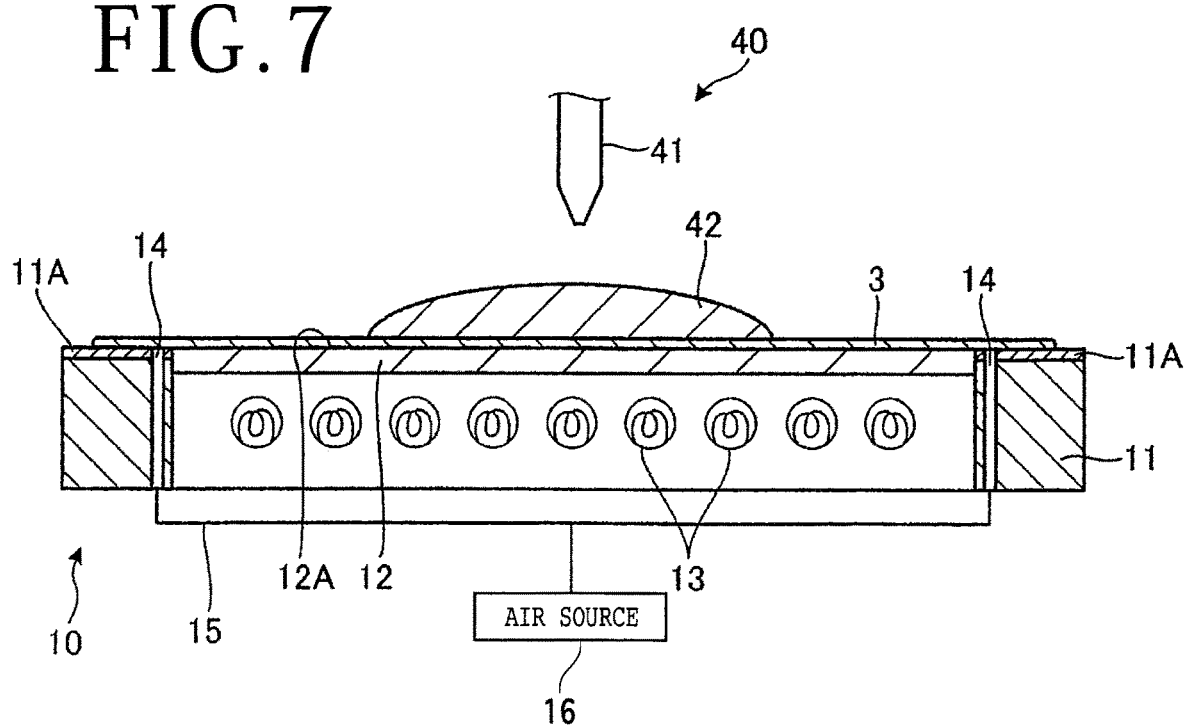
FIG. 7 is a schematic sectional view illustrating an operation of supplying a liquid resin to the upper surface of the sheet.
Figure 8:
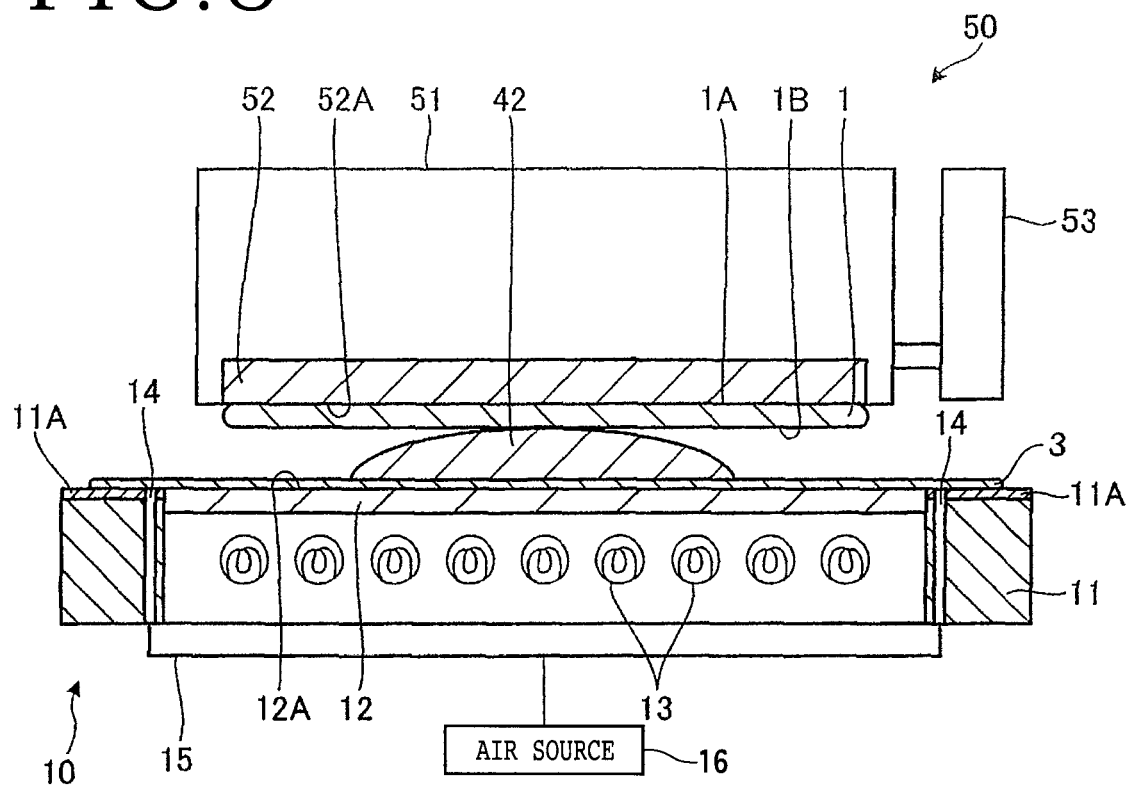
FIG. 8 is a schematic sectional view illustrating an operation of transferring a wafer to the position above the liquid resin.
Figure 9:
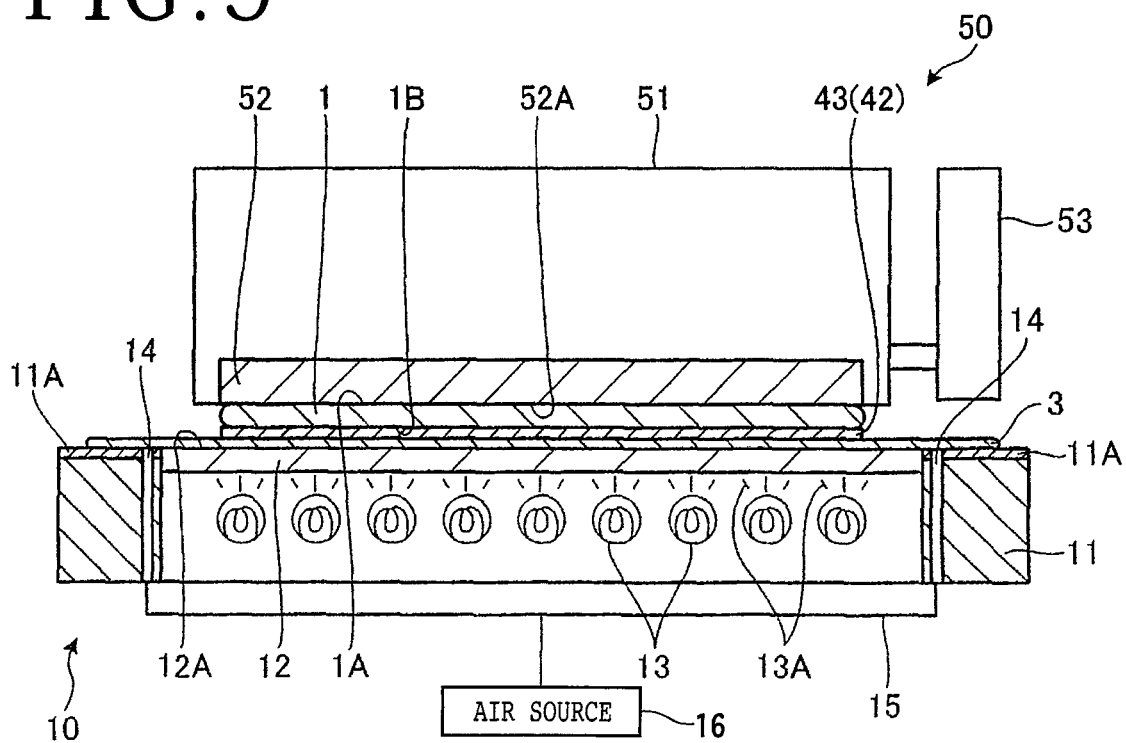
FIG. 9 is a schematic sectional view illustrating an operation of spreading the liquid resin and next curing the liquid resin spread to thereby form a protective member for the wafer.

The operation of the protective member forming apparatus 100 will now be described. FIG. 4 is a schematic view illustrating the operation of mounting the sheet 3 on the stage 10. FIG. 5 is a schematic view illustrating the operation of removing wrinkles from the sheet 3. FIG. 6 is a schematic view illustrating the condition of the sheet 3 mounted on the stage 10 after removing the wrinkles. FIG. 7 is a schematic view illustrating the operation of supplying a liquid resin 42 to the upper surface of the sheet 3. FIG. 8 is a schematic view illustrating the operation of transferring the wafer 1 to the liquid resin 42. FIG. 9 is a schematic view illustrating the operation of spreading the liquid resin 42 and next curing the same to form a protective member for the wafer 1.

(Sheet Transfer Operation)

First, the sheet 3 is transferred to the stage 10 by the sheet transfer unit 20. As illustrated in FIG. 1, the sheet transfer unit 20 is controlled by the control unit 60 to operate the horizontal moving mechanism (not illustrated) as holding the sheet 3 through the suction pads 22 under suction, thereby transferring the transfer arm 21 (the sheet 3) to the position above the stage 10. Thereafter, the elevating unit 23 is operated to lower the transfer arm 21 and the suction holding of the sheet 3 by the suction pads 22 is canceled. Accordingly, the sheet 3 is placed on the stage 10 as illustrated in FIG. 4. At this time, the sheet 3 is placed on the stage 10 so as to cover the plural air supply holes 14 formed in the stage body 11 as illustrated in FIG. 3. After placing the sheet 3 on the stage 10, the sheet transfer unit 20 is retracted from the stage 10. When the sheet 3 is placed on the stage 10, there is a case that wrinkles may be generated in the sheet 3. If a liquid resin is supplied to the upper surface of the sheet 3 having such wrinkles, the thickness of a resin layer formed on the sheet 3 may vary. Accordingly, the wrinkles are removed from the sheet 3 in the following step.

(Sheet Wrinkles Removing Operation)

The removal of wrinkles from the sheet 3 is performed by using the sheet pressing unit 30. As illustrated in FIG. 5, the sheet pressing unit 30 is controlled by the control unit 60 to operate the horizontal moving mechanism (not illustrated), thereby transferring the pressing pad 34 to the position above the sheet 3 placed on the stage 10. Thereafter, the elevating unit 35 is operated to lower the pressing pad 34. Accordingly, the central portion 34A of the pressing pad 34 comes into contact with at least a part of an inside area 3A of the sheet 3 as defined inside the plural air supply holes 14.

On the other hand, the stage 10 is controlled by the control unit 60 to operate the air source 16, thereby discharging air from the air supply holes 14. This air strikes the sheet 3 and then flows toward the peripheral edge of the sheet 3. Finally, this air is released between the sheet 3 and the stage 10. Accordingly, the other area of the sheet 3 where the pressing pad 34 does not come into contact with the sheet 3 (in particular, an outside area 3B of the sheet 3 as defined outside the plural air supply holes 14) is allowed to fly from the stage 10 due to the flow of the air discharged from the air supply holes 14, so that the sheet 3 in this area radially slides on the stage 10. In particular, the upper surface 11A of the stage body 11 is coated with fluororesin. Accordingly, the outside area 3B of the sheet 3 can easily slide on the upper surface 11A of the stage body 11 toward the peripheral edge of the stage body 11. In this manner, by supplying air to the peripheral portion of the sheet 3 in the condition where the central portion of the sheet 3 is pressed on the stage 10, the peripheral portion of the sheet 3 can be allowed to slide toward the peripheral edge of the stage 10, so that the wrinkles in the sheet 3 can be removed easily and effectively. Accordingly, the sheet 3 can be placed on the stage 10 with the wrinkles removed as illustrated in FIG. 6.

(Resin Supplying Operation)

Thereafter, as illustrated in FIG. 7, the nozzle 41 of the resin supply unit 40 is set above the center of the stage 10 (the sheet 3), and a liquid resin 42 is next supplied from the nozzle 41 to the upper surface of the sheet 3. When the liquid resin 42 is accumulated by a predetermined amount on the sheet 3 as illustrated in FIG. 7, the supply (drop) of the liquid resin 42 from the nozzle 41 to the sheet 3 is stopped. The amount of the liquid resin 42 to be supplied to the sheet 3 is determined according to the thickness of a protective member to be formed by curing the liquid resin 42 and the area of the wafer 1 (see FIG. 1).

(Liquid Resin Spreading Operation)

Thereafter, the liquid resin 42 supplied to the upper surface of the sheet 3 is spread in the following manner. In this preferred embodiment, the liquid resin 42 is spread by using the wafer transfer unit 50 for holding the wafer 1 (as-sliced wafer) and transferring it to the stage 10. More specifically, the wafer transfer unit 50 is controlled by the control unit 60 to operate the horizontal moving mechanism (not illustrated), thereby making the horizontal position of the wafer 1 held on the lower surface 52A of the holding member 52 coincide with the horizontal position of the stage 10. Thereafter, the elevating unit 53 is operated to lower the unit body 51 toward the stage 10. When the unit body 51 is lowered, the wafer 1 held on the lower surface 52A of the holding member 52 comes into contact with the liquid resin 42 accumulated on the sheet 3 placed on the stage 10. Thereafter, the unit body 51 is further lowered to press the liquid resin 42, thereby spreading the liquid resin 42 in the radial direction of the wafer 1. Accordingly, the liquid resin 42 is spread on the whole of the lower surface 1B of the wafer 1.

While the wafer transfer unit 50 for transferring the wafer 1 is used to spread the liquid resin 42 by lowering the unit body 51 to press the liquid resin 42 in this preferred embodiment, a pressing unit (not illustrated) may be used to spread the liquid resin 42 as a modification. More specifically, after transferring the wafer 1 to the liquid resin 42 on the sheet 3 by using the wafer transfer unit 50, the wafer transfer unit 50 is retracted from the stage 10. Thereafter, the pressing unit is set above the stage 10 and then operated to press the wafer 1 through the liquid resin 42 against the sheet 3 placed on the stage 10. Thus, any means capable of pressing the wafer 1 through the liquid resin 42 against the sheet 3 may be used to spread the liquid resin 42.

(Resin Curing Operation)

After spreading the liquid resin 42, the plural UV lamps 13 provided in the stage body 11 are turned on to apply ultraviolet light 13A to the liquid resin 42 as illustrated in FIG. 9. Accordingly, the liquid resin 42 is cured by the stimulation of the ultraviolet light 13A, thereby forming a protective member 43 for protecting the whole of the lower surface 1B of the wafer 1. Thereafter, the suction holding of the wafer 1 by the holding member 52 is canceled, and the unit body 51 is raised by the elevating unit 53 to thereby separate the holding member 52 from the wafer 1.

Thereafter, the upper surface 1A of the wafer 1 opposite to the lower surface 1B is ground by a grinding wheel or the like in the condition where the protective member 43 is attached to the lower surface 1B. Thereafter, the protective member 43 is separated from the lower surface 1B of the wafer 1, and the lower surface 1B of the wafer 1 is similarly ground in the condition where the upper surface 1A ground is held on a table. As a result, undulation and warpage can be removed from the wafer 1 to flatten both surfaces of the wafer 1.

As described above, the protective member forming apparatus 100 for forming the protective member 43 on the lower surface (first surface) 1B of the wafer 1 includes the stage 10 for mounting the sheet 3, the stage 10 having the stage body 11 and the glass table 12 supported to the stage body 11 so as to be surrounded by the stage body 11, the stage body 11 having the plural air supply holes 14 opening to the upper surface 11A of the stage body 11 and connected to the air source 16. The protective member forming apparatus 100 further includes the wafer transfer unit 50 adapted to be moved to the position above the stage 10 for holding the wafer 1, the resin supply unit 40 for supplying the liquid resin 42 to the upper surface of the sheet 3, and the pressing pad 34 vertically movably supported so as to be opposed to the sheet 3. The pressing pad 34 is adapted to come into contact with at least a part of the inside area 3A of the sheet 3 placed on the stage 10 so as to cover the plural air supply holes 14, the inside area 3A of the sheet 3 being defined inside the plural air supply holes 14, thereby pressing the sheet 3 in the inside area 3A. With this configuration, air is supplied from the plural air supply holes 14 to thereby make the outside area 3B of the sheet 3 fly from the stage 10, the outside area 3B being not in contact with the pressing pad 34. Accordingly, the outside area 3B of the sheet 3 can slide toward the peripheral edge of the stage 10, thereby removing the wrinkles from the sheet 3. Accordingly, the sheet 3 can be placed on the stage 10 with the wrinkles removed before supplying the liquid resin 42.

Further, according to this preferred embodiment, the upper surface 11A of the stage body 11 is coated with fluororesin. Accordingly, the peripheral portion of the sheet 3 can easily slide on the upper surface 11A of the stage body 11 owing to the flow of the air supplied from the air supply holes 14, so that the wrinkles can be removed from the sheet 3 easily and effectively.

The present invention is not limited to the above preferred embodiment, but various modifications may be made without departing from the scope of the present invention. In the above preferred embodiment, the protective member forming apparatus is used to form a protective member by applying a resin to the first surface of an as-sliced wafer, so as to remove undulation and warpage from the as-sliced wafer. As a modification, the protective member forming apparatus of the present invention may be used in grinding a wafer having asperities such as bumps on the front side (first surface), in which a protective member is first formed by applying a resin on the front side of the wafer, and the back side (second surface) of the wafer is next ground.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A protective member forming apparatus forming a protective member on a wafer having a first surface and a second surface opposite to the first surface, the protective member being formed on the first surface of the wafer, the protective member forming apparatus comprising:

a stage mounting a sheet, the stage having a frame and a chuck table supported to the frame so as to be surrounded by the frame, the frame having a plurality of air supply holes opening to an upper surface of the frame and connected to an air source;

a holding unit adapted to be moved to a position opposed to the stage for holding the wafer;

a resin supply unit supplying a resin to the upper surface of the sheet placed on the stage;

a sheet pressing pad vertically movably supported so as to be opposed to the sheet placed on the stage; and a control unit controlling the operation of the air source, the holding unit, the resin supply unit, and the sheet pressing pad, wherein the resin is supplied to the upper surface of the sheet placed on the stage by the resin supply unit, and the first surface of the wafer held by the holding unit is pressed through the resin against the sheet, thereby spreading the resin to form the protective member on the first surface of the wafer, the sheet pressing pad is controlled by the control unit to come into contact with a central portion of the sheet placed on the stage, the air source is controlled by the control unit to supply air from the air supply holes in a condition where the sheet pressing pad is in contact with the central portion of the sheet, and a peripheral portion of the sheet not in contact with the sheet pressing pad is made to fly from the stage due to a flow of the air supplied from the air supply holes and to slide toward a peripheral edge of the stage, thereby removing wrinkles from the sheet.

2. The protective member forming apparatus according to claim 1, wherein the frame of the stage is coated with fluororesin.

3. A protective member forming apparatus forming a protective member on a wafer having a first surface and a second surface opposite to the first surface, the protective member being formed on the first surface of the wafer, the protective member forming apparatus comprising:

a stage mounting a sheet, the stage having a frame and a chuck table supported to the frame so as to be surrounded by the frame, the frame having a plurality of air supply holes opening to an upper surface of the frame and connected to an air source;

a holding unit adapted to be moved to a position opposed to the stage for holding the wafer;

a resin supply unit supplying a resin to the upper surface of the sheet placed on the stage;

a sheet pressing pad vertically movably supported so as to be opposed to the sheet placed on the stage, and a control unit controlling the operation of the air source, the holding unit, the resin supply unit, and the sheet pressing pad, wherein the resin is supplied to the upper surface of the sheet placed on the stage by the resin supply unit, and the first surface of the wafer held by the holding unit is pressed through the resin against the sheet, thereby spreading the resin to form the protective member on the first surface of the wafer, and the sheet pressing pad is adapted to come into contact with a part of the sheet placed on the stage in an area inside the air supply holes, thereby pressing the sheet.

* * * * *